(12) United States Patent
Knierim

(10) Patent No.: US 11,619,697 B2
(45) Date of Patent: Apr. 4, 2023

(54) CALIBRATION OF MAGNETIC FIELD SENSOR FOR CURRENT PROBE

(71) Applicant: Tektronix, Inc., Beaverton, OR (US)

(72) Inventor: Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/220,857

(22) Filed: Apr. 1, 2021

(65) Prior Publication Data

US 2022/0317225 A1 Oct. 6, 2022

(51) Int. Cl.
*G01R 35/00* (2006.01)
*G01R 15/20* (2006.01)

(52) U.S. Cl.
CPC ......... *G01R 35/005* (2013.01); *G01R 15/202* (2013.01)

(58) Field of Classification Search
CPC ............................ G01R 35/005; G01R 15/202
USPC ...................................... 324/117 H
See application file for complete search history.

(56) References Cited

U.S. PATENT DOCUMENTS

| | | | | |
|---|---|---|---|---|
| 8,106,646 | B2* | 1/2012 | Ariyama | H03K 5/24 324/225 |
| 2009/0174415 | A1* | 7/2009 | Verspecht | G01R 35/005 324/601 |
| 2013/0002275 | A1* | 1/2013 | Min | G01R 31/3191 324/750.02 |
| 2017/0248674 | A1* | 8/2017 | Patton | G01R 29/10 |
| 2019/0310325 | A1* | 10/2019 | Leisenheimer | G01R 33/0017 |
| 2021/0072309 | A1* | 3/2021 | Guan | G01R 15/207 |
| 2021/0318404 | A1* | 10/2021 | Wei | G01R 29/12 |

* cited by examiner

*Primary Examiner* — Tung X Nguyen
*Assistant Examiner* — Robert P Alejnikov, Jr.
(74) *Attorney, Agent, or Firm* — Miller Nash LLP; Andrew J. Harrington

(57) ABSTRACT

A test and measurement instrument for measuring a current in a device under test, comprising an input configured to receive signals from a magnetic field probe; and one or more processors configured to measure, from a signal from the magnetic field probe, a magnetic field generated by a current-carrying conductor of the device under test based on a known current, determine a calibration factor based on the known current and the magnetic field, and generate a calibrated measurement of an unknown current in the current-carrying conductor using a magnetic field generated by the current-carrying conductor based on the unknown current and the calibration factor.

24 Claims, 5 Drawing Sheets

CALIBRATION OF MAGNETIC FIELD SENSOR FOR CURRENT PROBE

TECHNICAL FIELD

This disclosure is directed to systems and methods related to test and measurement systems, and in particular, to calibrating a magnetic field sensor as a current probe for the test and measurement system.

BACKGROUND

Electrical current creates a magnetic field encircling the current in a circuit, so a magnetic field (H-field) sensor can be used as a form of current probe. H-field probes have been proposed to measure current but suffer from at least two considerable drawbacks. First, magnetic fields observed at H-field probes are sensitive to the placement of the probe, both in distance from and alignment with respect to the current flow, as well as the current flow itself. Second, H-field probes are sensitive to magnetic fields generated by other nearby current-carrying conductors. The nearby current-carrying conductors can cause quite significant interference, or crosstalk from other current waveforms with the observation of the desired current waveform.

Both the drawbacks have been addressed in conventional systems by mathematically integrating the magnetic field around a path encircling the current-carrying conductor of interest, such as, for example, by Rogowski coils and Faraday-effect fiber current probes, or by concentrating the magnetic field in a single location by encircling the conductor with a magnetic core. However, both of these approaches require wrapping the current probe around the current-carrying conductor which can often be impractical, such as on a printed circuit board. It is desirable to address the calibration and crosstalk issues without requiring the probe to fully encircle the current of interest.

Examples of the disclosure address these and other deficiencies of the prior art.

BRIEF DESCRIPTION OF THE DRAWINGS

Aspects, features and advantages of examples of the present disclosure will become apparent from the following description of example in reference to the appended drawings in which.

DESCRIPTION

Disclosed herein is a calibration for a magnetic field, or H-probe, to measure electrical current of a device under test without the need to encase or encircle the device under test. As will be described in more detail below, examples of the disclosure calibrate an H-field probe near a single conductor by inserting a known current into the conductor, measuring the resultant magnetic field, and dividing the measured field by the known current to obtain a calibration factor.

Figure 1:
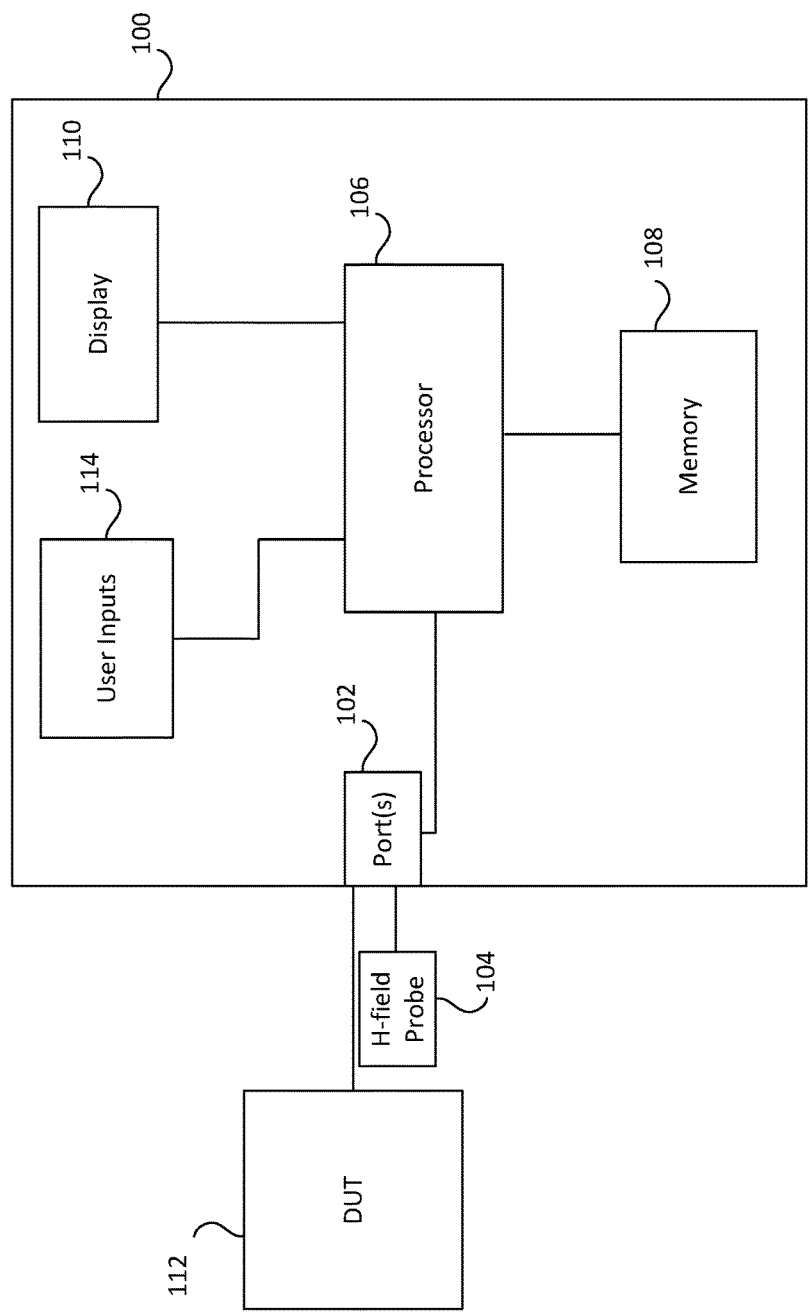
FIG. 1 is a block diagram of a test and measurement instrument according to examples of the disclosure.

FIG. 1 is a block diagram of an example test and measurement instrument 100, such as an oscilloscope, for implementing examples disclosed herein. The test and measurement instrument 100 includes one or more ports 102, which may be any electrical signaling medium. Ports 102 may include receivers, transmitters, and/or transceivers. Each port 102 may be included in a channel of the test and measurement instrument 100. For example, one port 102 in one example of the disclosure can output a known current to a device under test 112 and another port can be connected to an H-field probe 104 and receive the magnetic field reading from the H-field probe 104. The ports 102 are coupled with one or more processors 106 to process the signals and/or waveforms received at the ports 102 from the H-field probe 104. Although only one processor 106 is shown in FIG. 1 for ease of illustration, as will be understood by one skilled in the art, multiple processors 106 of varying types may be used in combination, rather than a single processor 106.

The ports 102 can also be connected to a measurement unit in the test and measurement instrument 100, which is not depicted for ease of illustration. Such a measurement unit can include any component capable of measuring aspects (e.g., voltage, amperage, amplitude, etc.) of a signal received via ports 102. The test and measurement instrument 100 may include additional hardware and/or processors, such as conditioning circuits, an analog to digital converter, and/or other circuitry to convert a received signal to a waveform for further analysis. The resulting waveform can then be stored in a memory 108, as well as displayed on a display 110.

The one or more processors 106 may be configured to execute instructions from memory 108 and may perform any methods and/or associated steps indicated by such instructions, such as calibrating the H-field probe 104 for measurement of a current of the device under test 112. Memory 108 may be implemented as processor cache, random access memory (RAM), read only memory (ROM), solid state memory, hard disk drive(s), or any other memory type. Memory 108 acts as a medium for storing data, computer program products, and other instructions.

User inputs 114 are coupled to the one or more processors 106. User inputs 114 may include a keyboard, mouse, trackball, touchscreen, and/or any other controls employable by a user to interact with a GUI on the display 110. The display 110 may be a digital screen, a cathode ray tube based display, or any other monitor to display waveforms, measurements, and other data to a user. While the components of test and measurement instrument 100 are depicted as being integrated within test and measurement instrument 100, it will be appreciated by a person of ordinary skill in the art that any of these components can be external to test instrument 100 and can be coupled to test instrument 100 in any conventional manner (e.g., wired and/or wireless communication media and/or mechanisms). For example, in some configurations, the display 110 may be remote from the test and measurement instrument 100.

Figure 2:
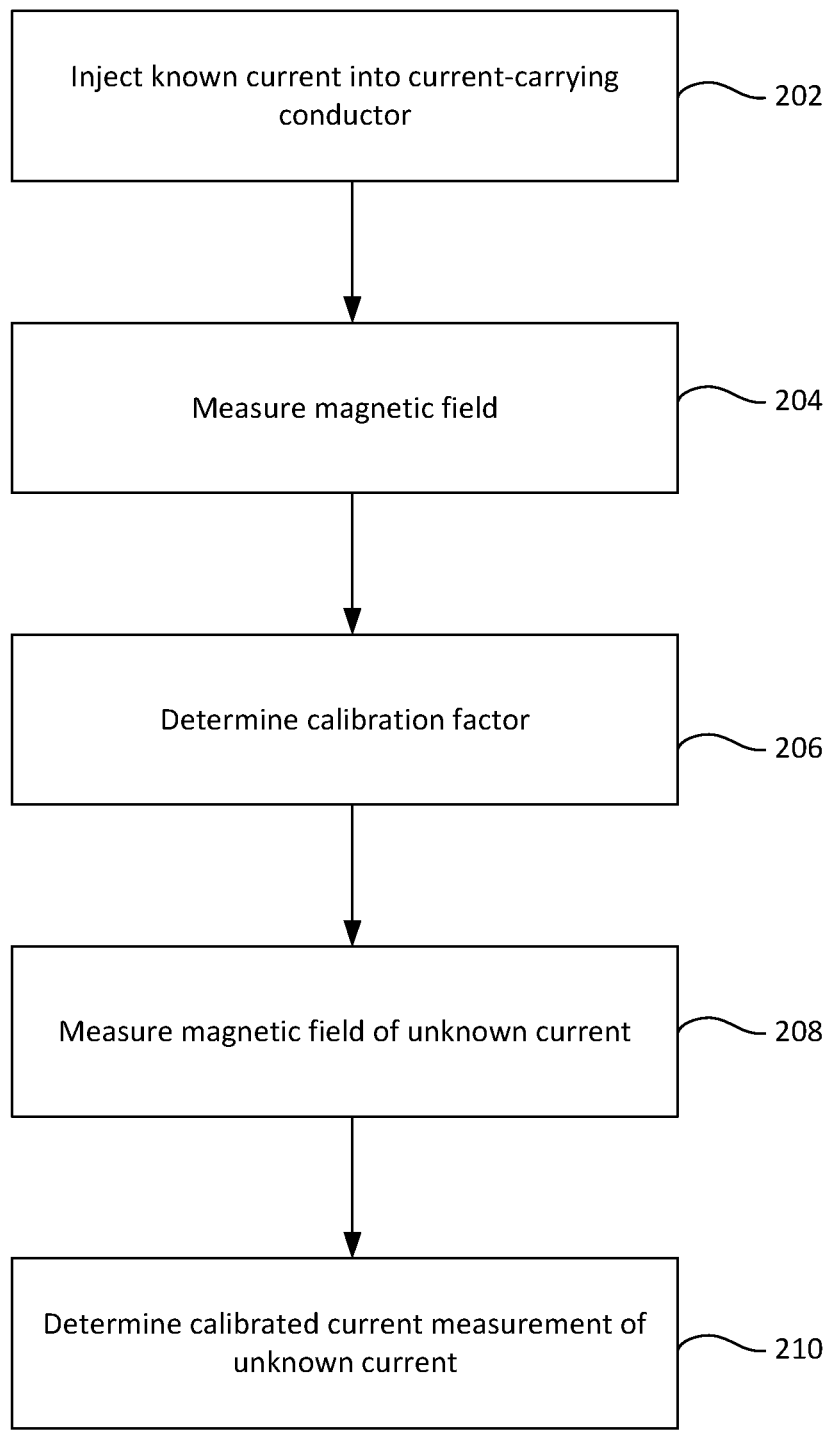
FIG. 2 is a flow chart of an example operation of the test and measurement instrument of FIG. 1.

FIG. 2 is a flow chart illustrating operation of the test and measurement instrument 100 for calibrating the H-field probe 104. Although not shown in the flow chart, a user can begin by placing the H-field probe 104 near the current-carrying conductor of interest on or in the DUT 112. Once placed, in some examples, the test and measurement instrument 100 can inject a known current in operation 202 into the current-carrying conductor on the device under test through the one or more ports 102. In other examples, the known current may be injected by another device and the amount of the current may be input into the test and measurement instrument 100 through the user interface 114.

With the known current flowing through the current-carrying conductor, H-field probe 104 can measure the resultant magnetic field from the known current in the current-carrying conductor in operation 204. The one or more processors 106 receive the measured magnetic field and can determine a calibration factor by diving the measured magnetic field by the known current to obtain the calibration factor in operation 206. The calibration factor is a function of the H-field probe 104 placement and orientation, but not a function of the signal and/or calibration frequency, as long as the distance from the H-field probe 104 to the current being monitored is small compared to the wavelength of the signal or calibration frequency. That is, the H-field probe 104 is sensing near-field radiation.

In operation 208, the device under test 112 can then operate under normal conditions and the H-field probe 104 can measure the magnetic field of an unknown current. In operation 210, the one or more processors 106 receives the measured magnetic field for the unknown current and determines the unknown current based on the measured magnetic field and the calibration factor. This can be done, for example, by the one or more processors 106 multiplying the measured magnetic field by an inverse of the calibration factor to determine the calibrated measurement of the unknown current.

FIG. 2 illustrates a flow chart where calibration is performed prior to a device under test 112 generating an unknown current is turned on. The example of FIG. 2 may utilize a recalibration step, including a device under test power cycle, when the H-field probe 104 is physically moved, whether intentionally or unintentionally.

Figure 3:
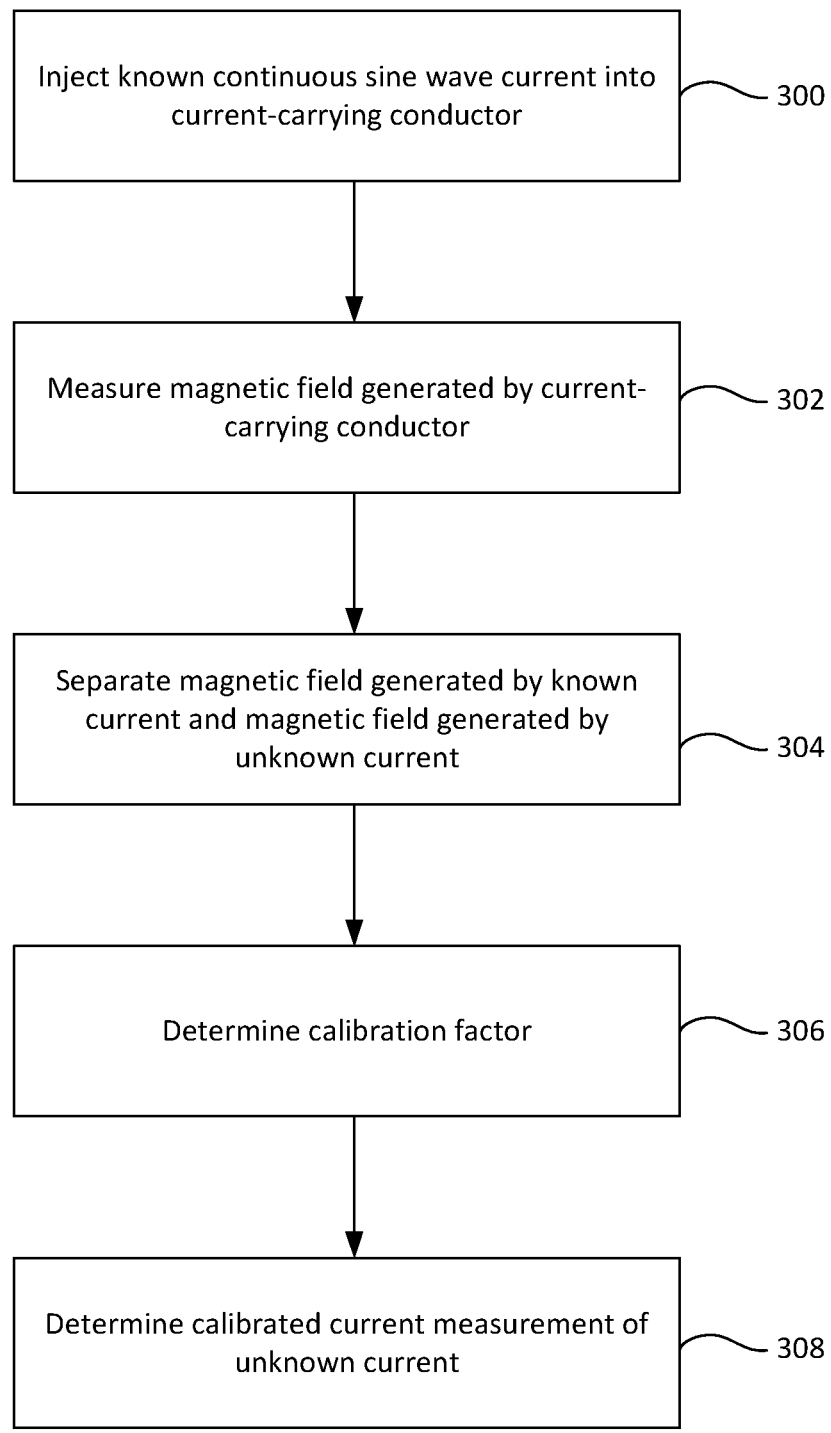
FIG. 3 is a flow chart of another example operation of the test and measurement instrument of FIG. 1.

FIG. 3 illustrates a flow chart for other examples of the disclosure that can perform calibration simultaneously with measuring an unknown current. In this example, in operation 300, a known continuous sine wave, such as a pilot tone, is injected through the current-carrying conductor of the device under test 112. The current-carrying conductor is also carrying an unknown current from the operation of the device under test 112. The continuous sine wave signal is generated such that the frequency of the continuous sine wave is outside the bandwidth of the measurement to be made. A user may input into the user inputs 114 a bandwidth of the measurement to be made so that the test and measurement instrument 100 can ensure that the continuous sine wave is outside the bandwidth of the measurement.

In operation 302, the H-field probe 104 can measure the magnetic field generated by the unknown current in the device under test 112, as well as the magnetic field generated by the continuous sine wave. In operation 304, the test and measurement instrument 100 may further include a filter that can separate the magnetic field generated by the continuous sine wave. The test and measurement instrument 100 can use the separated magnetic field generated by the known continuous sine wave to calculate a calibration factor in operation 306, as discussed above with respect to operation 206. Using the calibration factor, the test and measurement instrument 100 can determine the calibrated measurement of the unknown current in operation 308.

Figure 4:
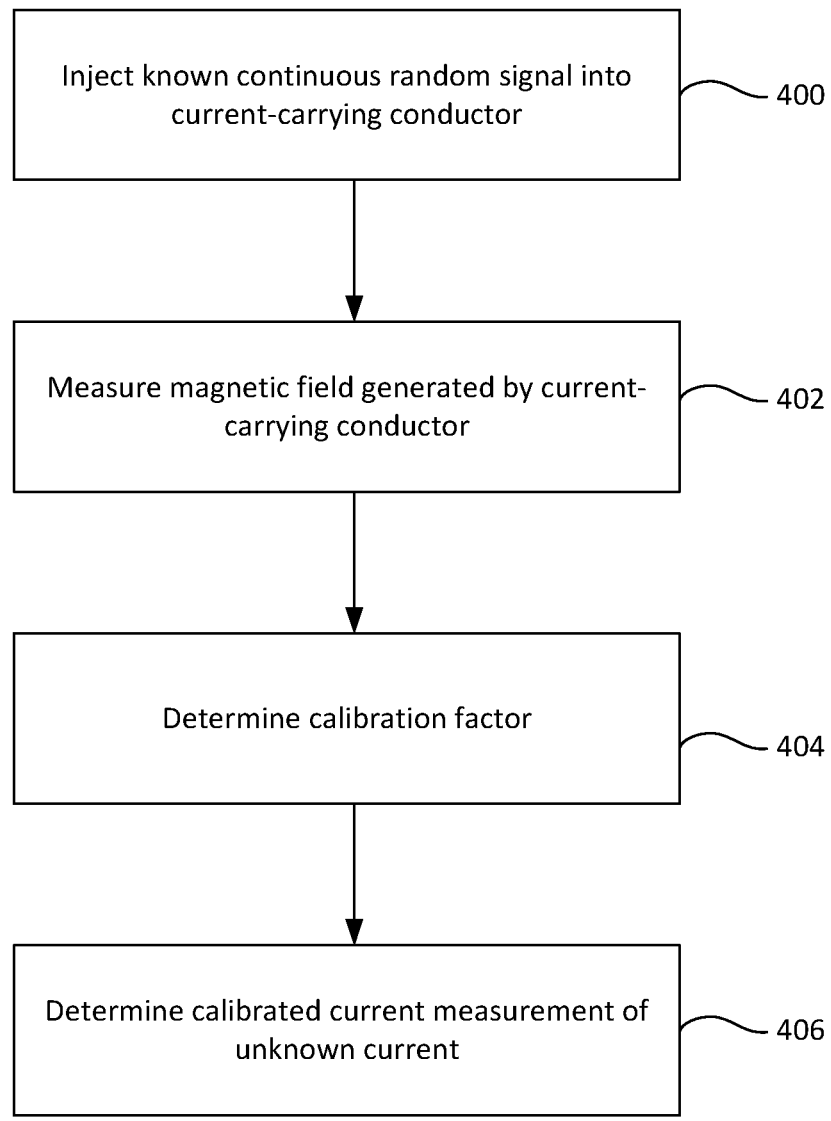
FIG. 4 is a flow chart of another example operation of the test and measurement instrument of FIG. 1.

FIG. 4 illustrates yet another example for calibrating the measurement of a current using an H-field probe 104. Similar to the example shown in FIG. 3, a calibration signal may be sent continuously during measurement of the unknown current in operation 400. The calibration signal in this example, however, may be a continuous random signal, such as a continuous pseudo-random binary sequence (PRBS) signal, a spread-spectrum sine wave signal, or any other random broadband limited-amplitude source signal.

In operation 402, the H-field probe 104 can measure the magnetic field generated by the unknown current in the device under test 112, as well as the magnetic field generated by the continuous random signal. In operation 404, the test and measurement instrument 100 may calculate or determine the calibration factor. In this example, the calibration factor is the continuous cross-correlation of the calibration current with the measured magnetic field divided by the auto-correlation of the calibration current with itself. The known calibration current can be subtracted from the product of the measured magnetic field and the inverse of the calibration value to determine the remaining, unknown current in operation 406.

The time duration over which correlations are calculated present a trade-off. That is, shorter durations allow faster tracking of physical movement of the H-field probe 104, while longer durations provide better accuracy by greater averaging of any random correlation of the unknown signal's magnetic field with the calibration current.

Examples of the disclosure, however, are not limited to single H-field probes 104. In some examples, multiple H-field probes 104 may be provided and connected to the test and measurement instrument 100 through the ports 102.

Calibration approaches with multiple H-field probes 104 and multiple calibration current sources can also help solve crosstalk issues. If there are a number, N, of current conductors in close proximity, and a number, M, of H-field probes 104 in proximity to these same conductors, with M being greater than or equal to N, then an N×M sensitivity matrix A can be defined. The N×M sensitivity matrix A can be defined where element $A_{i,j}$ represents the H-field induced in probe j by current flowing in conductor i.

If the number of H-field probes 104 M is equal to the number of current conductors, N, i.e when M=N, then the unknown currents in the conductors can be determined by multiplying the matrix inverse of A by a column vector of H-field probe 104 measurements Y. When the number of H-field probes 104 M is greater than the number of current-carrying conductors N, i.e. when M>N, a least squares linear regression technique may be applied to estimate the unknown currents with minimum noise, as shown in equation (1), where C is a column vector of the unknown currents and Y is a column vector of the magnetic field measurements:

$$C=[A \cdot A^T]^{-1} \cdot A \cdot Y \tag{1}$$

The examples discussed above with respect to FIGS. 2, 3, and 4 for separating the magnetic fields from the calibration and the unknown currents for the single current-carrying conductor and probe can also apply for the multiple current-carrying conductor situation as well.

That is, for example, a calibration current can be inserted into one current-carrying conductor at a time while the device under test 112 is powered off, allowing the measurements of one row of A at a time. Or, a number of different calibration currents can be sent continuously and concurrently with the unknown measurement by choosing a different frequency for the pilot-tone signal in each current-carrying conductor, and the resultant H-field measurement can be separated in the frequency domain. Finally, orthogonal and uncorrelated pseudo-random sequences can be chosen for each calibration current. As with the examples discussed above with respect to FIGS. 3 and 4, a magnetic field generated by each of the known currents would need to be isolated or separated from the measured magnetic field that includes the unknown current when the known currents are sent concurrently with the device under test 112 turned on.

To avoid potential large noise gains in inverting A (when M is equal to N) or $A \cdot A^T$ (when M is greater than N), at least one H-field probe 104 can be placed near and oriented with the magnetic field from each one of the N current-carrying conductors. Larger numbers of H-field probes 104 increase the likelihood of achieving less noise gains, but at the expense of requiring a larger channel or port 102 count in the test and measurement instrument 110, as well as a digitizer (not shown) in the test and measurement instrument 100 for capturing the magnetic field sensor waveforms.

Figure 5:
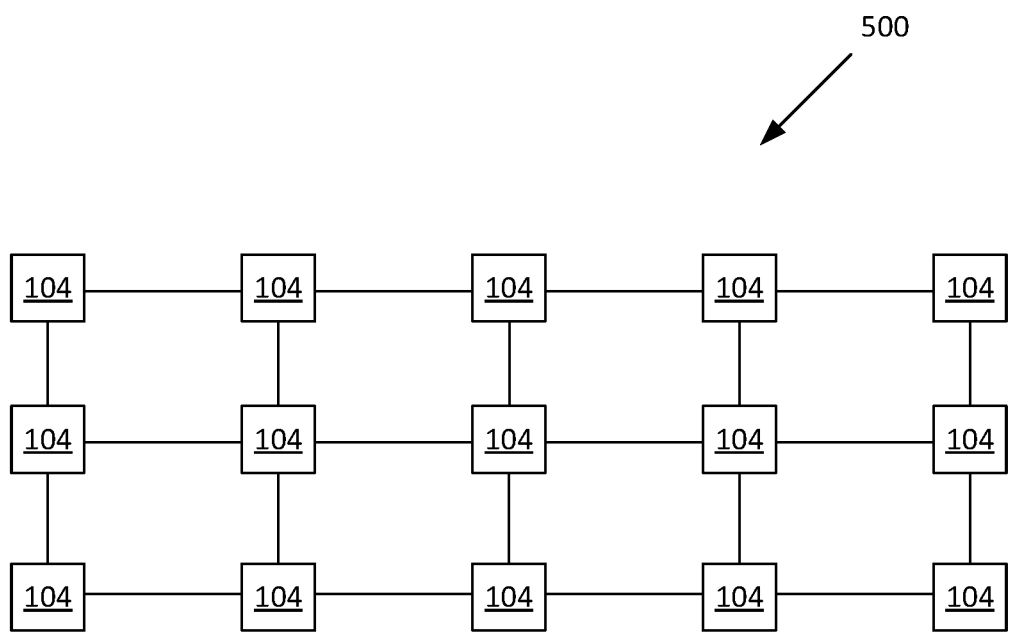
FIG. 5 is a diagram illustrating an array of magnetic field sensors for use with the test and measurement instrument of FIG. 1.

In some examples, a number of H-field probes 104 may be located within or on a flexible material or fabric. For example, as shown in FIG. 5, an array 500 of H-field probes 104 may be provided that is flexible. The entire array 500 of H-field probes 104 may be positioned on or laid on top of the device under test to measure a number of different current-carrying conductors.

As discussed above, a known current would be injected into each current-carrying conductor, either while the device under test is turned off and no unknown currents are flowing or simultaneously with the unknown currents, but in a higher frequency or in a random sequence to isolate the known currents. An array 500 of H-field probes 104 can allow for a plurality of measurement points, which with equation (1) discussed above, allows for averaging and more accurate measurements of each unknown current. The array 500 also provides a benefit to the user to not have to place each individual H-field probe 104 close to the current-carrying conductors, but instead allows the user to lay the entire array 500 over the device under test 112.

In some situations, there may be sources of significant magnetic fields from outside the device under test 112, such as due to the earth's magnetic field, current flow in power lines, fields from electrical machinery, etc. To the extent the sources of these external fields are distant relative to the spacing of the multiple H-field probes 104, and therefore the fields are essentially constant versus position within the sensor array of the H-field probes 104, the fields can be treated as coming from three independent current loops encircling the sensor array of H-field probes 104 in each of the three-dimensions of space. Then, if the number of H-field probes 104 is greater than or equal to the number of current-carrying conductors, plus three, i.e., M>=N+3, the one or more processors 106 can solve for the unknown currents of the N current-carrying conductors and the three vector components of the external magnetic field.

If the number of H-field probes 104 M are independently movable, that is, each are separate from the others, determination of the calibration matrix A can require actually placing the three independent current loops around the device under test 112 and sourcing three additional calibration currents. However, if the number of H-field probes 104 M are held in relative fixed positions and orientations, the response of the sensors to an external magnetic field, that is, three rows of A may be measured during probe manufacturing and stored either in a memory of the H-field probe 104 or in a memory 108 of the test and measurement unit for later use in calibration.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An example of the technologies may include any one or more, and any combination of, the examples described below.

Example 1 a test and measurement instrument for measuring a current in a device under test, comprising an input configured to receive signals from a magnetic field probe; and one or more processors configured to measure, from a signal from the magnetic field probe, a magnetic field generated by a current-carrying conductor of the device under test based on a known current, determine a calibration factor based on the known current and the magnetic field, and generate a calibrated measurement of an unknown current in the current-carrying conductor using a magnetic field generated by the current-carrying conductor based on the unknown current and the calibration factor.

Example 2 is the test and measurement instrument of example 1, wherein the magnetic field generated by the current-carrying conductor is generated based on the known current and the unknown current.

Example 3 is the test and measurement instrument of example 2, wherein the known current is a continuous sine wave outside a bandwidth of the unknown current, the test and measurement instrument further comprising a filter configured to separate the magnetic field generated by the known current and the magnetic field generated by the unknown current from the signal of the magnetic field probe.

Example 4 is the test and measurement instrument of example 2, wherein the known current is a continuous random signal and determining the calibration factor includes cross-correlating the known current and the magnetic field and dividing by an auto-correlation of the known current with itself.

Example 5 is the test and measurement instrument of example 4, wherein the calibrated measurement of the unknown current is generated by subtracting the known current from the product of the magnetic field and an inverse of the calibration factor.

Example 6 is the test and measurement instrument of any one of examples 1-5, further comprising a plurality of inputs, each input configured to receive signals from a respective magnetic field probe, and the one or more processors are further configured to measure, from signals from the respective magnetic field probes, magnetic fields generated by current-carrying conductors based on known currents, determine calibration factors for the magnetic field probes based on the known currents and the magnetic fields, and generate calibrated measurements of unknown currents in the current-carrying conductors using the magnetic fields generated by the current-carrying conductors based on unknown currents and the calibration factors.

Example 7 is the test and measurement instrument of example 6, wherein the number of magnetic fields measured from respective magnetic field probes is equal to or greater than a number of current-carrying conductors to be measured in the device under test.

Example 8 is the test and measurement instrument of example 7, wherein the number of magnetic fields measured from respective magnetic field probes is greater than the number of current-carrying conductors to be measured in the device under test.

Example 9 is the test and measurement instrument of example 6, wherein each known current is a continuous sine wave of a different frequency outside a bandwidth of the unknown currents, the test and measurement instrument further comprising a filter configured to separate the magnetic fields generated by the known currents and the magnetic fields generated by the unknown currents from the signals of the magnetic field probes.

Example 10 is the test and measurement instrument of example 6, wherein each of the known currents are different continuous random signals and determining the calibration factors includes cross-correlating the known currents and the magnetic fields and dividing by an auto-correlation of the known currents with themselves.

Example 11 is the test and measurement instrument of example 10, wherein the calibrated measurements of the unknown currents are generated by subtracting the known currents from the product of the magnetic fields and an inverse of the calibration factors.

Example 12 is the test and measurement instrument of examples 6-11, further comprising a flexible array of magnetic field probes structured to be placed over the device under test.

Example 13 is a method for measuring a current in a device under test, comprising measuring a magnetic field generated by a current-carrying conductor in the device under test based on a known current; determining a calibration factor based on the known current and the magnetic field; and generating a calibrated measurement of an unknown current in the current-carrying conductor using a magnetic field generated by the current-carrying conductor based on the unknown current and the calibration factor.

Example 14 is the method of example 13, wherein the magnetic field includes a magnetic field generated by the current-carrying conductor based on the known current and the unknown current.

Example 15 is the method of example 14, wherein the known current is a continuous sine wave outside a bandwidth of the unknown current, and the method further comprises separating the magnetic field generated by the known current and the magnetic field generated by the unknown current from the signal of the magnetic field probe.

Example 16 is the method of example 14, wherein the known current is a continuous random signal and determining the calibration factor includes cross-correlating the known current and the magnetic field and dividing by an auto-correlation of the known current with itself.

Example 17 is the method of example 16, wherein the calibrated measurement of the unknown current is generated by subtracting the known current from the product of the magnetic field and an inverse of the calibration factor.

Example 18 is the method of any one of examples 13-17, further comprising measuring, from signals from respective magnetic field probes, a plurality of magnetic fields generated by a plurality of current-carrying conductors based on known currents, determining calibration factors for the magnetic field probes based on the known currents and the magnetic fields, and generating calibrated measurements for the unknown currents in the electric current-carrying conductors using the magnetic fields generated by the current-carrying conductors based on the unknown currents and the calibration factors.

Example 19 is the method of example 18, wherein the number of magnetic fields measured from respective magnetic field probes is equal to or greater than a number of current-carrying conductors to be measured in the device under test.

Example 20 is the method of example 19, wherein the number of magnetic fields measured from respective magnetic field probes is greater than the number of current-carrying conductors to be measured in the device under test.

Example 21 is one or more non-transitory computer-readable storage media comprising instructions, which, when executed by one or more processors of a test and measurement instrument, cause the test and measurement instrument to measure a magnetic field generated by a current-carrying conductor in a device under test based on a known current; determine a calibration factor based on the known current and the magnetic field; and generate a calibrated measurement of an unknown current in the current-carrying conductor using a magnetic field generated by the current-carrying conductor based on the unknown current and the calibration factor.

Example 22 is the one or more non-transitory computer-readable storage media of example 21, wherein the known current is a continuous sine wave outside a bandwidth of the unknown current, and the one or more non-transitory computer-readable storage media further comprising instructions to filter the magnetic field generated by the known current and the magnetic field generated by the unknown current from the signal of the magnetic field probe.

Example 23 is the one or more non-transitory computer-readable storage media of example 21, wherein the known current is a continuous random signal and determining the calibration factor includes cross-correlating the known current and the magnetic field and dividing by an auto-correlation of the known current with itself.

Example 24 is the one or more non-transitory computer-readable storage media of example 23, wherein the calibrated measurement of the unknown current is generated by subtracting the known current from the product of the magnetic field and an inverse of the calibration factor.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

I claim:

1. A test and measurement instrument for measuring a current in a device under test, comprising:
    an input configured to receive signals from a magnetic field probe; and
    one or more processors configured to:
        measure, from a signal from the magnetic field probe, a magnetic field generated by a current-carrying conductor of the device under test based on a known current,
        determine a calibration factor based on the known current and the magnetic field, and
        generate a calibrated measurement of an unknown current in the current-carrying conductor using a magnetic field generated by the current-carrying conductor based on the unknown current and the calibration factor.

2. The test and measurement instrument of claim 1, wherein the magnetic field generated by the current-carrying conductor is generated based on the known current and the unknown current.

3. The test and measurement instrument of claim 2, wherein the known current is a continuous sine wave outside a bandwidth of the unknown current, the test and measurement instrument further comprising a filter configured to separate the magnetic field generated by the known current and the magnetic field generated by the unknown current from the signal of the magnetic field probe.

4. The test and measurement instrument of claim 2, wherein the known current is a continuous random signal and determining the calibration factor includes cross-correlating the known current and the magnetic field and dividing by an auto-correlation of the known current with itself.

5. The test and measurement instrument of claim 4, wherein the calibrated measurement of the unknown current is generated by subtracting the known current from the product of the magnetic field and an inverse of the calibration factor.

6. The test and measurement instrument of claim 1, further comprising a plurality of inputs, each input configured to receive signals from a respective magnetic field probe, and the one or more processors are further configured to:
    measure, from signals from the respective magnetic field probes, magnetic fields generated by current-carrying conductors based on known currents,
    determine calibration factors for the magnetic field probes based on the known currents and the magnetic fields, and
    generate calibrated measurements of unknown currents in the current-carrying conductors using the magnetic fields generated by the current-carrying conductors based on unknown currents and the calibration factors.

7. The test and measurement instrument of claim 6, wherein the number of magnetic fields measured from respective magnetic field probes is equal to or greater than a number of current-carrying conductors to be measured in the device under test.

8. The test and measurement instrument of claim 7, wherein the number of magnetic fields measured from respective magnetic field probes is greater than the number of current-carrying conductors to be measured in the device under test.

9. The test and measurement instrument of claim 6, wherein each known current is a continuous sine wave of a different frequency outside a bandwidth of the unknown currents, the test and measurement instrument further comprising a filter configured to separate the magnetic fields generated by the known currents and the magnetic fields generated by the unknown currents from the signals of the magnetic field probes.

10. The test and measurement instrument of claim 6, wherein each of the known currents are different continuous random signals and determining the calibration factors includes cross-correlating the known currents and the magnetic fields and dividing by an auto-correlation of the known currents with themselves.

11. The test and measurement instrument of claim 10, wherein the calibrated measurements of the unknown currents are generated by subtracting the known currents from the product of the magnetic fields and an inverse of the calibration factors.

12. The test and measurement instrument of claim 6, further comprising a flexible array of magnetic field probes structured to be placed over the device under test.

13. A method for measuring a current in a device under test, comprising:
    measuring a magnetic field generated by a current-carrying conductor in the device under test based on a known current;

determining a calibration factor based on the known current and the magnetic field; and generating a calibrated measurement of an unknown current in the current-carrying conductor using a magnetic field generated by the current-carrying conductor based on the unknown current and the calibration factor.

14. The method of claim 13, wherein the magnetic field includes a magnetic field generated by the current-carrying conductor based on the known current and the unknown current.

15. The method of claim 14, wherein the known current is a continuous sine wave outside a bandwidth of the unknown current, and the method further comprises separating the magnetic field generated by the known current and the magnetic field generated by the unknown current from the signal of the magnetic field probe.

16. The method of claim 14, wherein the known current is a continuous random signal and determining the calibration factor includes cross-correlating the known current and the magnetic field and dividing by an auto-correlation of the known current with itself.

17. The method of claim 16, wherein the calibrated measurement of the unknown current is generated by subtracting the known current from the product of the magnetic field and an inverse of the calibration factor.

18. The method of claim 13, further comprising:

measuring, from signals from respective magnetic field probes, a plurality of magnetic fields generated by a plurality of current-carrying conductors based on known currents, determining calibration factors for the magnetic field probes based on the known currents and the magnetic fields, and generating calibrated measurements for the unknown currents in the current-carrying conductors using the magnetic fields generated by the current-carrying conductors based on the unknown currents and the calibration factors.

19. The method of claim 18, wherein the number of magnetic fields measured from respective magnetic field probes is equal to or greater than a number of current-carrying conductors to be measured in the device under test.

20. The method of claim 19, wherein the number of magnetic fields measured from respective magnetic field probes is greater than the number of current-carrying conductors to be measured in the device under test.

21. One or more non-transitory computer-readable storage media comprising instructions, which, when executed by one or more processors of a test and measurement instrument, cause the test and measurement instrument to:

measure a magnetic field generated by a current-carrying conductor in a device under test based on a known current;

determine a calibration factor based on the known current and the magnetic field; and generate a calibrated measurement of an unknown current in the current-carrying conductor using a magnetic field generated by the current-carrying conductor based on the unknown current and the calibration factor.

22. The one or more non-transitory computer-readable storage media of claim 21, wherein the known current is a continuous sine wave outside a bandwidth of the unknown current, and the one or more non-transitory computer-readable storage media further comprising instructions to filter the magnetic field generated by the known current and the magnetic field generated by the unknown current from the signal of the magnetic field probe.

23. The one or more non-transitory computer-readable storage media of claim 21, wherein the known current is a continuous random signal and determining the calibration factor includes cross-correlating the known current and the magnetic field and dividing by an auto-correlation of the known current with itself.

24. The one or more non-transitory computer-readable storage media of claim 23, wherein the calibrated measurement of the unknown current is generated by subtracting the known current from the product of the magnetic field and an inverse of the calibration factor.

* * * * *